(12) United States Patent
Hanson

(10) Patent No.: US 8,143,768 B2
(45) Date of Patent: Mar. 27, 2012

(54) MINIATURE MECHANICAL RESONATOR DEVICE

(76) Inventor: Richard A. Hanson, Leedburg, FL (US)

( * ) Notice: Subject to any disclaimer, the term of this patent is extended or adjusted under 35 U.S.C. 154(b) by 147 days.

(21) Appl. No.: 12/784,441

(22) Filed: May 20, 2010

(65) Prior Publication Data

US 2010/0327693 A1    Dec. 30, 2010

Related U.S. Application Data

(60) Provisional application No. 61/220,992, filed on Jun. 26, 2009.

(51) Int. Cl.
| | |
|---|---|
| H03H 9/05 | (2006.01) |
| H03H 9/19 | (2006.01) |
| H03H 9/205 | (2006.01) |
| H01L 41/04 | (2006.01) |
| G01P 15/097 | (2006.01) |
| G01P 1/08 | (2006.01) |
| G01P 1/16 | (2006.01) |

(52) U.S. Cl. ..... 310/367; 310/361; 310/370; 73/514.29; 73/862.59

(58) Field of Classification Search ............. 310/361, 310/367, 370; 73/514.29, 862.59
See application file for complete search history.

(56) References Cited

U.S. PATENT DOCUMENTS

| | | | |
|---|---|---|---|
| 4,215,570 A | 8/1980 | Eer Nisse | |
| 4,299,122 A * | 11/1981 | Ueda et al. | 73/862.59 |
| 4,372,173 A | 2/1983 | EerNisse | |
| 4,415,827 A | 11/1983 | Chuang | |
| 4,901,586 A | 2/1990 | Blake | |
| 5,331,242 A | 7/1994 | Petri | |
| 5,367,217 A | 11/1994 | Norling | |
| 5,435,195 A | 7/1995 | Meier | |
| 5,450,762 A | 9/1995 | Woodruff | |
| 5,574,220 A * | 11/1996 | Amand et al. | 73/514.29 |
| 6,269,698 B1 | 8/2001 | Woodruff | |
| 6,414,416 B1 * | 7/2002 | Janiaud et al. | 310/321 |
| 6,450,033 B1 * | 9/2002 | Ito et al. | 73/514.29 |
| 6,600,252 B2 | 7/2003 | Nguyen | |

* cited by examiner

Primary Examiner — Thomas M Dougherty
(74) Attorney, Agent, or Firm — Christensen O'Connor Johnson Kindness PLLC

(57) ABSTRACT

Novel configurations for a miniature vibrating beam mechanical resonator provide low energy transfer to a supporting structure and low sensitivity to mounting misalignment. A symmetric suspended portion includes two vibrating beams that vibrate normal to a quiescent plane of the resonator, 180 degrees out of phase relative to one another. The vibrating beams are attached, at least at one end, to a torsional coupling element that is joined to a mounting pad along a non-translating suspension boundary. Counterbalances are attached to the vibrating beams, and the resonator is configured such that dynamic forces and moments coupled to each torsional coupling element from the vibrating beams are balanced along each nominal non-translating suspension boundary proximate to the symmetry axis and along the symmetry axis proximate to each nominal non-translating suspension boundary. Each non-translating suspension boundary is a torsional axis for a twisting deformation of the first torsional coupling element.

17 Claims, 5 Drawing Sheets

MINIATURE MECHANICAL RESONATOR DEVICE

FIELD OF THE INVENTION

The invention relates generally to miniature mechanical resonators and, more particularly, to resonant vibrating beam type transducer elements configured for low energy loss and to minimize the resonant frequency sensitivity to non-ideal fabrication and mounting conditions.

BACKGROUND OF THE INVENTION

Various sensors, including load cells, accelerometers, pressure sensors, temperature sensors and others, may utilize a miniature mechanical resonator as a transducer element. Some such sensors may be designed such that the physical quality to be measured results in axial tension or compression being applied to a vibrating beam to alter its resonant frequency. Some such sensors may be designed such that the physical quality to be measured results in axial tension or compression being applied to a vibrating beam to alter its resonant frequency. Temperature sensors may be designed such that their resonant frequency is altered based on their temperature-sensitive material properties. Various miniature electromechanical filters may also utilize one or more miniature mechanical resonators as filtering elements.

Prior art teachings indicate that the performance of such mechanical resonators is degraded if there is a transfer or loss of energy between the vibrating beam and an external supporting structure, for example due to reaction forces where the beam element is coupled to a supporting structure. Such transfer or loss of energy can lower the Q of the vibrating beam, and/or cause an undesirable unpredictable change in the resonant frequency.

One prior art method used to limit energy transfer in miniature vibrating beam mechanical resonators is the utilization of multiple resonant beams located proximate to one another and vibrating out of phase, such that their reaction forces cancel one another proximate to the end of the beams. Examples of such multiple beam elements are disclosed in U.S. Pat. Nos. 4,215,570; 4,372,173; 4,415,827; 4,901,586; 5,331,242; and 5,367,217, each of which is incorporated herein by reference in its entirety. However, for such known configurations, it has been observed that the effectiveness of this technique will be degraded when the resonant frequencies of the individual beams vary from one another, for example due to fabrication variations. In addition, such configurations are sensitive to frequency shifts and/or non-linearities due to beam distortion arising from non-ideal mounting conditions, misaligned force application, or the like.

Another prior art method used to limit energy transfer in miniature vibrating beam elements is the utilization of a resonant beam (or beams) that is (are) coupled to one or more counterbalances configured such that the reaction forces of the vibrating beam and the counterbalances cancel one another. Examples of such elements are disclosed in U.S. Pat. Nos. 5,435,195; 5,450,762; and 6,269,698, each of which is incorporated herein by reference in its entirety. The '762 and '698 patents emphasize configurations wherein the vibrating beam element is fabricated as a generally planar element, and the resonant beam vibrates in the plane of the element. The '762 and '698 patents teach a counterbalancing technique wherein either the residual forces, or moments, can be reduced at the beam supports, each at the expense of increase in the other. Therefore, the allocation of residual forces and moments are determined for each particular application. In any case, a reduced but still undesirable energy transfer may occur due to the unbalanced residual forces or moments. In addition, counterbalanced designs such as those disclosed the '762, '698, and '195 patents may still be sensitive to non-ideal mounting conditions (e.g., non-planar mounting or distortion). The '195 patent emphasizes configurations wherein the vibrating beam element is fabricated as a generally planar element, and a single beam, and a counter balance arrangement that is symmetrical around the beam axis, vibrate along a direction that is perpendicular to the plane of the element. The '195 patent discloses various spring configurations that may be incorporated with the suspension of the vibrating beam element in order to reduce its sensitivity to non-ideal mounting conditions. However, such spring configurations may introduce unwanted spurious frequencies, frequency nonlinearities, stress concentrations, size restrictions, and/or additional resonances, any of which may be undesirable in various applications. In addition, in the case of force sensing vibrating beam elements, such spring configurations generally reduce the sensitivity of the resonant frequency to applied external forces, which is particularly detrimental to force sensing applications.

U.S. Pat. No. 6,600,252, which is incorporated herein by reference in its entirety, describes miniature mechanical resonators that are integrated into micro-electromechanical devices with associated circuitry, and employed as electromechanical frequency filtering elements. The '252 patent teaches relatively crude means of supporting the miniature mechanical resonators, including the use of dimples that extend between a support structure and nodal points of the mechanical resonators along a direction normal to the mechanical resonator. Such support means may be relatively impractical to fabricate and/or less effective than is desirable in terms of energy isolation.

A configuration for a miniature mechanical resonator that can provide lower energy transfer to an external supporting structure and/or provide lower sensitivity to non-ideal mounting conditions or distortion, while avoiding one or more of the previously described deficiencies or other limitations inherent in the prior art, would be desirable.

SUMMARY OF THE INVENTION

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Briefly, the present invention is directed to novel configurations for a miniature vibrating beam mechanical resonator that provides low energy transfer to an "external" supporting structure and/or low sensitivity to non-ideal mounting conditions or distortion. In various embodiments, such mechanical resonators may be employed in force sensors, pressure sensors, temperature sensors, and the like. In some embodiments such mechanical resonators may be integrated into micro-electromechanical devices with associated circuitry, and employed as electromechanical frequency filtering elements.

In various embodiments, a monolithic planar mechanical resonator according to this invention may comprise a first supporting portion comprising a first mounting pad, and a suspended portion configured with minor image symmetry relative to a first symmetry axis that extends along an X-axis direction in a quiescent plane of the mechanical resonator, the suspended portion joined to the first supporting portion along a first nominal non-translating suspension boundary that extends along a Y-axis direction that is orthogonal to the X-axis direction in the quiescent plane of the mechanical resonator. The suspended portion may comprise a first torsional coupling element that extends across the first symmetry axis along the Y-axis direction, the first torsional coupling element joined to the first supporting portion along the first nominal non-translating suspension boundary, and first and second symmetric vibrating portions located on respective first and second sides of the first symmetry axis. Each symmetric vibrating portion may comprise a vibrating beam that is elongated along the X-axis direction, the vibrating beam having first and second beam ends, the first beam end joined to the first torsional coupling element at a first coupling region on its respective side of the first symmetry axis.

According to one aspect of the invention, a first counterbalance may be joined to the vibrating beam at a first counterbalance joining region proximate to one of the first and second beam ends, and along an edge of the vibrating beam that faces away from the first symmetry axis, and the first counterbalance may be configured to extend along the Y-axis direction farther from the first symmetry axis than the vibrating beam and along the X-axis direction farther toward the first supporting portion than the first coupling region.

According to another aspect of the invention, the mechanical resonator is configured to provide an operative resonant mode with the first mounting pad mounted nominally along the quiescent plane of the mechanical resonator, and is configured such that in the operative resonant mode:

the first and second symmetric vibrating portions translate primarily along a Z-axis direction normal to the quiescent plane of the mechanical resonator and nominally 180 degrees out of phase relative to one another;

in each of the first and second symmetric vibrating portions, respectively, the vibrating beam and the first counterbalance rotate in phase with one another proximate to the first counterbalance joining region, about an axis extending along the Y-axis direction, and at least a portion of the first counterbalance translates nominally 180 degrees out of phase with a majority of the vibrating beam relative to the quiescent plane; and dynamic forces and dynamic moments arising from the first and second symmetric vibrating portions and coupled to the first torsional coupling element on the respective first and second sides of the first symmetry axis are nominally balanced along the first nominal non-translating suspension boundary proximate to the first symmetry axis and along the first symmetry axis proximate to the first nominal non-translating suspension boundary, such that the first nominal non-translating suspension boundary is nominally not translated away from the quiescent plane and is a nominal torsional axis for a twisting deformation of the first torsional coupling element.

According to a further aspect of the invention, in some embodiments, a majority of the first counterbalance may translate nominally 180 degrees out of phase with the majority of the vibrating beam relative to the quiescent plane.

According to a further aspect of the invention, in some embodiments, the first supporting portion may comprise a first bridge portion that extends from a nominal mounting boundary of the first mounting pad and is joined to the first torsional coupling element approximately along the first nominal non-translating suspension boundary. According to a further aspect of the invention, in some embodiments, the first torsional coupling element has a torsional coupling element dimension along the Y-axis direction and the first bridge portion is joined to the first torsional coupling element along a joining dimension that is shorter than the torsional coupling element dimension, such that the first torsional coupling element includes unconstrained edge portions proximate to the first nominal non-translating suspension boundary.

According to a further aspect of the invention, in some embodiments, the first counterbalance is configured to extend along the Y-axis direction farther from the first symmetry axis than the vibrating beam and along the X-axis direction farther toward the first supporting portion than the first nominal non-translating suspension boundary. According to a further aspect of the invention, in some embodiments, the first mounting pad is configured such that it is located between the first counterbalances of the first and second symmetric vibrating portions, and an extent of the first mounting pad along the X-axis direction at least partially overlaps with an extent of the first counterbalances along the X-axis direction.

In some embodiments, the mechanical resonator comprises a single-end supported configuration, wherein the first mounting pad is the only mounting pad and the second end of each vibrating beam is unsupported. In some such embodiments the first counterbalance joining region is proximate to the first beam end. In other such embodiments, the first counterbalance joining region is proximate to the second beam end.

According to a further aspect of the invention, in some embodiments, the miniature mechanical resonator is integrated into a micro-electromechanical device with associated circuitry and employed as electromechanical frequency filtering element, and the first mounting pad may be integrated with, and/or indistinguishable from, a substrate of the micro-electromechanical device.

In some embodiments, the mechanical resonator comprises a double-end supported configuration that further comprises features including a second supporting portion comprising a second mounting pad, and wherein the suspended portion is configured with mirror image symmetry relative to the first symmetry axis and also relative to a second symmetry axis that extends along the Y-axis direction in the quiescent plane of the mechanical resonator. The suspended portion is joined to the second supporting portion along a second nominal non-translating suspension boundary that extends along the Y-axis direction. The suspended portion may comprise a second torsional coupling element that extends across the first symmetry axis along the Y-axis direction, the second torsional coupling element joined to the second supporting portion along the second nominal non-translating suspension boundary. In the first and second symmetric vibrating portions, each symmetric vibrating portion may comprise the vibrating beam that is elongated along the X-axis direction, wherein the first beam end is joined to the first torsional coupling element at the first coupling region on its respective side of the first symmetry axis and the second beam end is joined to the second torsional coupling element at a second coupling region on its respective side of the first symmetry axis; and the first counterbalance is joined to the vibrating beam at the first counterbalance joining region proximate to the first beam ends, and a second counterbalance is joined to the vibrating beam at a second counterbalance joining region proximate to the second beam end and along the edge of the vibrating beam that faces away from the first symmetry axis.

According to a further aspect of the invention, the second counterbalance may be configured to extend along the Y-axis direction farther from the first symmetry axis than the vibrating beam and along the X-axis direction farther toward the second supporting portion than the second coupling region.

According to another aspect of the invention, the mechanical resonator is configured to provide an operative resonant mode with the first and second mounting pads mounted nominally along the quiescent plane of the mechanical resonator, and is configured such that in the operative resonant mode:

the first and second symmetric vibrating portions translate primarily along a Z-axis direction normal to the quiescent plane of the mechanical resonator and nominally 180 degrees out of phase relative to one another;

in each of the first and second symmetric vibrating portions, respectively, the vibrating beam and the first counterbalance rotate in phase with one another proximate to the first counterbalance joining region, about an axis extending along the Y-axis direction, and the vibrating beam and the second counterbalance rotate in phase with one another proximate to the second counterbalance joining region, about an axis extending along the Y-axis direction, and at least a portion of the first counterbalance and at least a portion of the second counterbalance translate nominally 180 degrees out of phase with a majority of the vibrating beam relative to the quiescent plane; and dynamic forces and dynamic moments arising from the first and second symmetric vibrating portions and coupled to the second torsional coupling element on the respective first and second sides of the first symmetry axis are nominally balanced along the second nominal non-translating suspension boundary proximate to the first symmetry axis and along the first symmetry axis proximate to the second nominal non-translating suspension boundary, such that the second nominal non-translating suspension boundary is nominally not translated away from the quiescent plane and is a nominal torsional axis for a twisting deformation of the second torsional coupling element.

According to a further aspect of the invention, in some embodiments, a majority of the first counterbalance and a majority of the second counterbalance translate nominally 180 degrees out of phase with the majority of the vibrating beam relative to the quiescent plane.

According to a further aspect of the invention, in some embodiments, the first supporting portion comprises a first bridge portion that extends from a nominal mounting boundary of the first mounting pad and is joined to the first torsional coupling element approximately along the first nominal non-translating suspension boundary, and the second supporting portion comprises a second bridge portion that extends from a nominal mounting boundary of the second mounting pad and is joined to the second torsional coupling element approximately along the second nominal non-translating suspension boundary. According to a further aspect of the invention, in some embodiments, the first torsional coupling element has a torsional coupling element dimension along the Y-axis direction, and the first bridge portion is joined to the first torsional coupling element along a joining dimension that is shorter than the torsional coupling element dimension, such that the first torsional coupling element includes unconstrained edge portions proximate to the first nominal non-translating suspension boundary, and the second torsional coupling element has a torsional coupling element dimension along the Y-axis direction, and the second bridge portion is joined to the second torsional coupling element along a joining dimension that is shorter than the torsional coupling element dimension, such that the second torsional coupling element includes unconstrained edge portions proximate to the second nominal non-translating suspension boundary.

According to a further aspect of the invention, in some embodiments, the first counterbalance is configured to extend along the Y-axis direction farther from the first symmetry axis than the vibrating beam and along the X-axis direction farther toward the first supporting portion than the first nominal non-translating suspension boundary, and the second counterbalance is configured to extend along the Y-axis direction farther from the first symmetry axis than the vibrating beam and along the X-axis direction farther toward the second supporting portion than the second nominal non-translating suspension boundary. According to a further aspect of the invention, in some embodiments, the first mounting pad is configured such that it is located between the first counterbalances of the first and second symmetric vibrating portions, and wherein an extent of the first mounting pad along the X-axis direction at least partially overlaps with an extent of the first counterbalances along the X-axis direction, and the second mounting pad is configured such that it is located between the second counterbalances of the first and second symmetric vibrating portions, and wherein an extent of the second mounting pad along the X-axis direction at least partially overlaps with an extent of the second counterbalances along the X-axis direction.

According to a further aspect of the invention, in some embodiments, the miniature mechanical resonator is integrated into a micro-electromechanical device with associated circuitry and employed as an electromechanical frequency filtering element, and the first and second mounting pads may be integrated with, and/or indistinguishable from, a substrate of the micro-electromechanical device.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
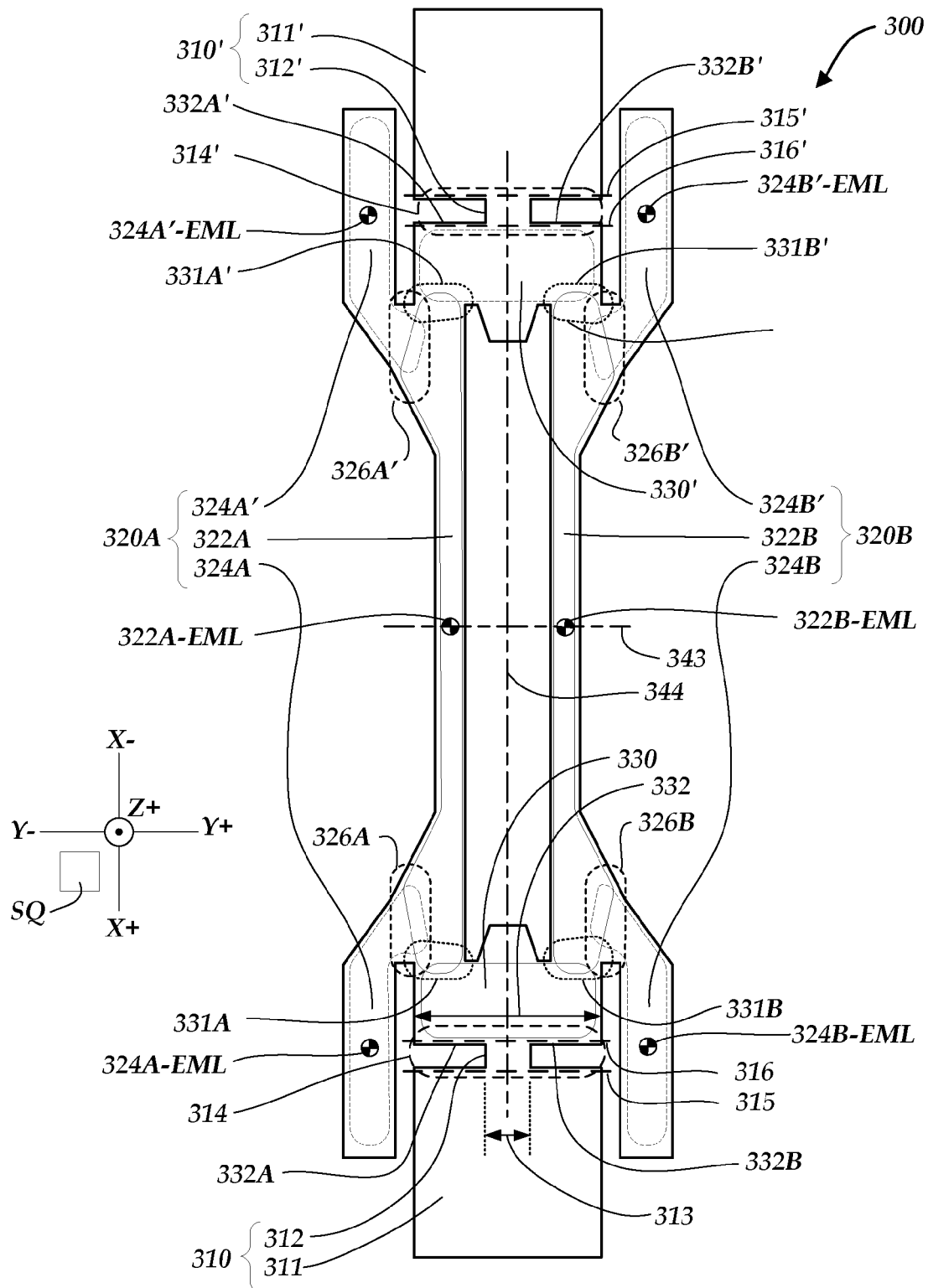
FIG. 1 is a plan view of a first configuration of a monolithic planar mechanical resonator according to the present invention.

FIG. 1 is a plan view of a first configuration of a monolithic planar mechanical resonator 300 according to the present invention. In one specific embodiment, the mechanical resonator 300 may be geometrically similar to the specific form and dimensional relationships illustrated in FIG. 1, and a unit square SQ is included in FIG. 1, for dimensional reference in case of figure distortion. However, in other embodiments the dimensional relationships between the various portions of the mechanical resonator 300 may vary from those illustrated, provided that the resulting configuration provides various design features and fulfills various design principles as outlined herein. FIG. 1 shows the mechanical resonator 300 is a double-end supported configuration that has a first symmetry axis 344 that is parallel to an X-axis direction, and a second symmetry axis 343 that is parallel to a Y-axis direction. According to a convention used throughout this application, the orthogonal X and Y direction axes shown in FIG. 1 coincide with the nominal plane of a mechanical resonator (e.g., the mechanical resonator 300) when it is not deformed or vibrating, also referred to as the quiescent plane. A numbering convention is used in FIG. 1, and other figures herein, as follows: Corresponding elements on opposite sides of the first symmetry axis 344 have similar numbers followed by suffixes "A" and "B," respectively (e.g., 322A and 322B). Corresponding elements on opposite sides of the second symmetry axis 343 have similar numbers which are "unprimed" and "primed," respectively (e.g., 324A and 324A'). Such corresponding elements are generally similarly named, similarly configured, and provide similar functions. Therefore, in the following description when one of such corresponding elements is described, the configuration and operation of its corresponding elements may be understood by analogy. It should be appreciated that dashed lines may be used in various figures herein to indicate the approximate extents of various regions, portions, or elements. Such dashed lines are positioned only approximately, to enhance the general recognition and understanding of the various regions, portions, or elements referred to in the description. The extents indicated by the dashed lines are intended to be exemplary only, and not limiting with respect to their exact locations or with respect to the definition of various elements of the invention. Identical reference numbers may refer to similar or identical regions, portions, or elements whether or not a dashed line is included with that region, portion, or element in each figure.

The mechanical resonator 300 is a planar monolithic element comprising first and second supporting portions 310 and 310', and a suspended portion located between the supporting portions 310 and 310'. In the embodiment shown in FIG. 1, the supporting portion 310 comprises a mounting pad 311 and bridge portion 312, and the supporting portion 310' is analogous. The suspended portion comprises first and second torsional coupling elements 330 and 330' that extend across the first symmetry axis 344 along the Y-axis direction, and first and second symmetric vibrating portions 320A and 320B located on respective first and second sides of the first symmetry axis 344. The first symmetric vibrating portion 320A comprises a vibrating beam 322A that is elongated along the X-axis direction, a first counterbalance 324A joined to the vibrating beam 322A proximate to a first end of the vibrating beam 322A and along an edge of the vibrating beam 322A that faces away from the first symmetry axis, at a first counterbalance joining region 326A. The first counterbalance 324A is configured to extend from first counterbalance joining region 326A along the Y-axis direction farther from the first symmetry axis than the vibrating beam 322A and along the X-axis direction farther toward the first supporting portion 310 than the first coupling region 331A. A second counterbalance 324A' is joined to that edge of the vibrating beam 322A proximate to a second end of the vibrating beam 322A, in a second counterbalance joining region 326A', and is configured in an analogous manner. The first end of the vibrating beam 322A is joined to the first torsional coupling element 330 on its respective side of the first symmetry axis 344 at a first coupling region 331A, and the second end of the vibrating beam 322A is joined to the second torsional coupling element 330' on its respective side of the first symmetry axis 344 at a second coupling region 331A'. The second symmetric vibrating portion 320B is analogous to the first symmetric vibrating portion 320A.

The torsional coupling element 330 is joined to, and suspended from, the supporting portion 310 along a nominal non-translating suspension boundary 316 at a suspension region 314, as described in greater detail below. The torsional coupling element 330' is joined to, and suspended from, the supporting portion 310' along a nominal non-translating suspension boundary 316', in an analogous manner. In one application, the mechanical resonator 300 may be used as a force transducer, with opposing external forces applied generally along the X-axis direction to the mounting pads 311 and 311', such that the resonant frequency of the first and second symmetric vibrating portions 320A and 320B responds to, and is indicative of, the applied external forces. The operative resonant mode and certain related features of the configuration of the mechanical resonator 300 are described in greater detail below, with reference to FIGS. 2 and 3.

In the embodiment shown in FIG. 1, the supporting portion 310 includes a bridge portion 312 that extends from a nominal mounting boundary 315 and is joined to the torsional coupling element 330 along the nominal non-translating suspension boundary 316. In various embodiments, the mechanical resonator 300 may be configured such that the dynamic reaction forces and dynamic moments arising in the operative resonant mode are approximately balanced proximate to and/or along the nominal non-translating suspension boundary 316, whereby the energy transfer from the suspended portion to the mounting pad 311 adjacent to the suspension region 314 is minimized to a desirable level, as described in greater detail below.

In various embodiments, the nominal mounting boundary 315 may approximately coincide with an edge of the mounting pad 311 and/or with the limits or boundary of a region where the mounting pad 311 is fixed or bonded to a support structure. In the embodiment shown in FIG. 1, the torsional coupling element 330 has a dimension 332 along the Y-axis direction, and the bridge portion 312 is joined to the torsional coupling element 330 along a dimension 313 that is narrower than the dimension 332, such that the torsional coupling element 330' includes unconstrained edge portions 332A and 332B proximate to the nominal non-translating suspension boundary 316. The features of the supporting portion 310' and the torsional coupling element 330' are analogous. Such a configuration may be advantageous in various embodiments, for optimally and robustly minimizing the energy transfer from the suspended portion to the mounting pad 311 adjacent to a suspension region 314, for reasons described below with reference to FIG. 3.

However, if should be appreciated that while providing unconstrained edge portions 332A and 332B proximate to the nominal non-translating suspension boundary 316 may provide some advantages in some embodiments, this feature may be omitted in various other embodiments, and some benefits of the invention may still be retained. In some embodiments where this feature is omitted, the dimension 313 and the dimension 332 may be approximately the same, and/or the nominal mounting boundary 315 and the nominal non-translating suspension boundary 316 may approximately coincide. Thus, in some embodiments the bridge portion 312 may be omitted, or merged with and indistinguishable from the torsional coupling element 330 or the mounting pad 311.

For purposes of describing certain design and/or operating principles of the mechanical resonator 300, it is convenient to define some "effective mass locations," designated with the reference number suffix "-EML" in FIG. 1. In the following description, an effective mass location may be thought of as roughly corresponding to the concept of a lumped center of mass for an associated element or area of the mechanical resonator 300. However, it will be appreciated that, in practice, the spatial distribution of each portion of mass of the mechanical resonator 300 will determine its dynamic resonant characteristics. Thus, it should be appreciated that such effective mass locations are illustrated only schematically and approximately in FIG. 1, and are intended only as convenient conceptual references. FIG. 1 shows an effective mass location 322A-EML for the vibrating beam 322A, and effective mass locations 324A-EML and 324A'-EML for the counterbalances 324A and 324A', respectively. Analogous effective mass locations 322B-EML, 324B-EML and 324B'-EML are also shown in FIG. 1. The effective mass locations result from the configurations of the corresponding elements as illustrated in FIG. 1 and previously described. It will be appreciated that effective mass locations shown in FIGURE depict locations along the X-axis direction and the Y-axis direction (e.g., in the quiescent plane). In later figures, the corresponding effective mass locations may be depicted at various positions along the Z-axis direction, to help explain desirable relationships between various elements of a mechanical resonator according to this invention, during an operative resonant mode. As shown in later figures, it will be appreciated that the effective mass location of an element may be located outside of the physical material of an element if that element is significantly deformed (e.g., similar to the conventional concept of the center of mass of an object).

Figure 2:
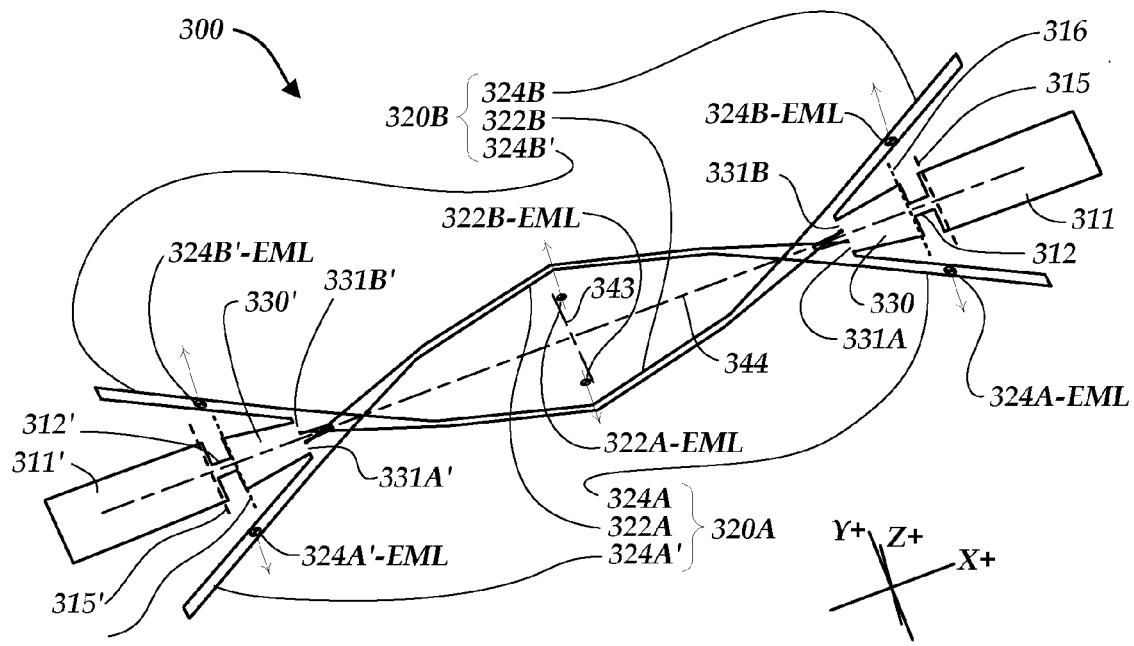
FIG. 2 is a perspective view of the mechanical resonator of FIG. 1, shown in wire frame outline and illustrating deflections of various portions of the mechanical resonator in an operative resonant mode of vibration.

FIG. 2 is perspective view of the mechanical resonator 300 of FIG. 1, shown in wire frame outline and illustrating the relative deflections of various portions of the mechanical resonator 300 in the operative resonant mode of vibration. The scale of the deflections is exaggerated for purposes of illustration. The various portions of the suspended portion of the mechanical resonator 300 all translate primarily along the Z-axis direction, normal to its quiescent plane, in the operative resonant mode. This is advantageous in comparison to resonators that vibrate primarily along the Y-axis direction, in that it may be particularly difficult to mount mounting pads such as the mounting pads 311 and 311' precisely in the quiescent plane, and/or apply axial forces precisely along a symmetry axis such as the symmetry axis 344, when operating a mechanical resonator as a force transducer. The nominal operative resonant mode shape and frequency of the mechanical resonator 300 may be less sensitive to such misalignments, particularly to misalignments along the Z-axis direction, in comparison to resonators that vibrate primarily along the Y-axis direction.

As shown in FIG. 2, the first and second symmetric vibrating portions 320A and 320B translate along the Z-axis direction nominally 180 degrees out of phase with one another. In one embodiment the operative mode may be excited, and its resonant frequency sensed, by fabricating the mechanical resonator 300 from a piezoelectric material (e.g., quartz) and driving the first and second vibrating beams 322A and 322B out of phase with one another using applied electrodes (not shown) and associated circuitry, according to known techniques. However, in other embodiments, other known methods of exciting miniature resonators and sensing their resonant frequency (e.g., optically-based methods) may be used.

Figure 3:
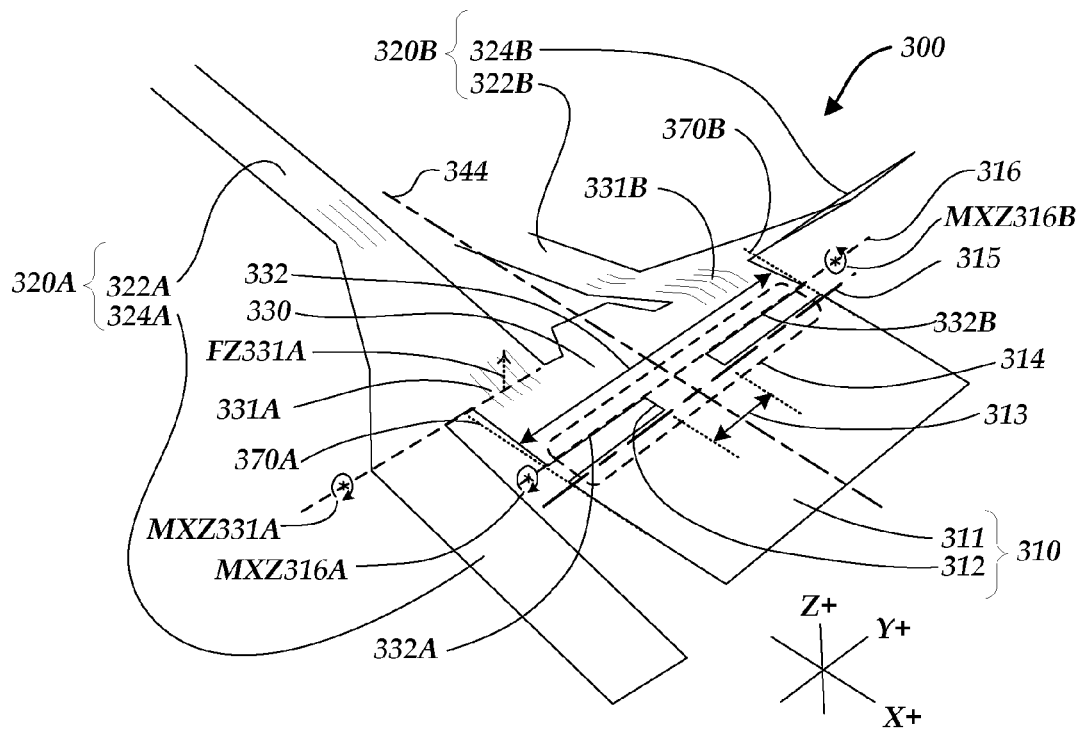
FIG. 3 is a detailed perspective view of a portion of the mechanical resonator of FIG. 1, shown in wire frame outline and illustrating deflections of various portions of the mechanical resonator in an operative resonant mode of vibration.

In various embodiments, the mechanical resonator 300 may be configured such that in the operative resonant mode, the ends of each of the vibrating beams 322A and 322B translate somewhat out of the quiescent plane, whereby each of the associated coupling regions 331A, 331A', 331B and 331B') may, by design, be deflected out of the quiescent plane of the mechanical resonator 300, as best shown in FIG. 3. In contrast to numerous teachings in the prior art, this is not significantly detrimental to the operating characteristics (e.g., the Q) of the mechanical resonator 300 because, in various embodiments, it is furthermore configured according to one aspect of this invention such that in the operative resonant mode dynamic reaction forces and dynamic moments are approximately balanced proximate to and/or along the nominal non-translating boundaries 316 and 316', as described in greater detail below. Thus, the energy transfer from the suspended portion, as a whole, to the supporting portions 310 and 310' may be approximately minimized. Thus, as may be seen by inspection of FIG. 2, and as described in greater detail below with reference to FIG. 3, although the observable twist or distortion of the first and second torsional coupling elements 330 and 330' indicate that they have significant Z-axis translations proximate to the coupling regions 331A, 331A', 331B and 331B', the torsional coupling portions 330 and 330' do not exhibit significant Z-axis translations proximate to and/or along the nominal non-translating boundaries 316 and 316'.

Inspection of FIG. 2 shows additional features associated with the configuration of the mechanical resonator 300 and the operative resonant mode. It may be seen that the vibrating beam 322A and the counterbalances 324A and 324A' are configured such that the vibrating beam 322A rotates in phase with the counterbalance 324A proximate to the counterbalance joining region 326A, about an axis extending along the Y-axis direction, and similarly rotates in phase with the counterbalance 324A' proximate to the counterbalance joining region 326A'. Also, the majority of the vibrating beam 322A translates nominally 180 degrees out of phase with the majority of the counterbalances 324A and 324A', relative to the quiescent plane. Thus, translational motion of the effective mass location 322A-EML of the vibrating beam 322A is approximately counterbalanced by opposing translational motion of the effective mass locations 324A-EML and 324A'-EML of the counterbalances 324A and 324A'. It will be appreciated that because the vibrating beam 322A is bent in FIG. 2, its effective mass location 322A-EML is closer to the quiescent plane than the physical mid-point, or maximum amplitude point, of the vibrating beam 322A. In various embodiments, the counterbalancing is such that translational nodes of the first symmetric vibrating portion 320A are located proximate to the coupling regions 331A and 331A', which reduces the Z-axis dynamic reaction forces arising at the coupling regions 331A and 331A' to a first degree. However, the coupling regions 331A and 331A' are not precisely at translational nodes, as indicated by the Z-axis translation of the coupling region 331A seen in FIG. 3 and described in greater detail below. The second symmetric vibrating portion 320B is configured in an analogous manner.

Because the first and second symmetric vibrating portions 320A and 320B vibrate nominally 180 degrees out of phase with one another, any residual dynamic Z-axis forces that are not balanced within individual symmetric vibrating portions 320A or 320B are nominally balanced overall, by the combination of the symmetric vibrating portions 320A and 320B, such that approximately no dynamic Z-axis forces are exerted on the mounting pads 311 and 311'. The mechanical resonator 300 is furthermore configured such that moments about the symmetry axis 344 due to dynamic forces in the suspended portion are nominally balanced overall. Thus, as seen in FIG.

2, and explained in greater detail below with reference to FIG. 3, the nominal non-translating suspension boundary 316 (and 316') is not significantly rotated about the symmetry axis 344. As a result, the mounting pad 311 (and/or 311') experiences no significant dynamic moment about the symmetry axis 344, despite the out-of-phase vibrations of the first and second vibrating beams 322A and 332B.

FIG. 3 is detailed perspective view of a portion of the mechanical resonator 300 of FIGS. 1 and 2, shown in wire frame outline and illustrating deflections of various portions of the mechanical resonator 300 in the operative resonant mode of vibration. The elements shown in FIG. 3 and described below include elements proximate to the first torsional coupling element 330 and the nominal non-translating suspension boundary 316. The quiescent plane is indicated in FIG. 3 by the reference lines 370A and 370B.

In particular, FIG. 3 shows that the mechanical resonator 300 is configured such that dynamic forces and dynamic moments arising from the first and second symmetric vibrating portions 320A and 320B, which are coupled to the first torsional coupling element 330 by the first ends of the vibrating beams 322A and 322B at the coupling regions 331A and 331B, respectively, are nominally balanced along the first symmetry axis 344 proximate to the nominal non-translating suspension boundary 316, and along the nominal non-translating suspension boundary 316 proximate to the first symmetry axis 344. This is evidenced by inspection of the nominal non-translating suspension boundary 316 in FIG. 3, which is nominally not translated or rotated away from the quiescent plane, while at the same time it is shown to be a nominal torsional axis for a twisting deformation of the torsional coupling element 330. If a net Z-axis force acted along the nominal non-translating suspension boundary 316 in the operative resonant mode, it would be deflected out of the quiescent plane.

Clearly, in the absence of the counterbalances 324A, and 324B, the out-of-phase dynamic forces exerted on the torsional coupling element 330 by the vibrating beams 322A and 322B would cause it to twist significantly about the symmetry axis 344. However, the counterbalances 324A and 324B are configured (e.g., with respect to their mass distribution and location) to counterbalance the twisting moment about the symmetry axis that the vibrating beams 322A and 322B apply to the torsional coupling element 330, such that the total of the dynamic moments about the symmetry axis 344 is approximately zero proximate to the nominal non-translating suspension boundary 316.

As previously indicated, the coupling region 331A is not a translational node of the first symmetric vibrating portion 320A, as indicated by the Z-axis translation of the coupling region 331A shown in FIG. 3. It may be inferred that the end of the vibrating beam exerts a small Z-axis force FZ331A, and a bending moment MXZ331A in an XZ plane, on the torsional coupling element 330 at the coupling region 331A. It may be inferred that the resultant of the force FZ331A and the bending moment MXZ331A at the nominal non-translating suspension boundary 316 is the resultant moment MXZ316A and no net Z-axis force. By symmetry, a balancing opposite resultant moment MXZ316B is generated by the second symmetric vibrating portion 320B. The nominal non-translating suspension boundary 316 may thus be characterized as a torsional axis, and the twisting deformation of the torsional coupling element 330 about that torsional axis couples the frequencies of the first and second symmetric vibrating portions 320A and 320B to provide a high-Q mechanical resonator. Because, the nominal non-translating suspension boundary 316 nominally does not translate or rotate, it may be inferred that the energy transfer from the nominal non-translating suspension boundary 316 to the adjacent supporting portion 310 is approximately minimized. As previously outlined, the supporting portion 310 may be joined to the torsional coupling element 330 along a dimension 313 that is narrower than a dimension 332 of the torsional coupling element 330 along the Y-axis direction. Thus, the torsional coupling element 330 includes unconstrained edge portions 332A and 332B at the nominal non-translating suspension boundary 316. Such unconstrained edges cannot strain the mounting pad 311, providing an additional measure to robustly minimizing the energy transfer from the suspended portion to the mounting pad 311 and also minimize sensitivity to mounting misalignments. Elements proximate to the torsional coupling element 330' and the nominal non-translating suspension boundary 316' may be similar to the analogous elements outlined above.

It will be appreciated that to achieve the characteristics outlined above at the nominal non-translating suspension boundary 316 (and/or 316'), the masses and the "effective mass locations" of the various elements of the suspended portion of the mechanical resonator 300 may be adjusted relative to one another to provide the outlined balances of various dynamic forces and moments. In various embodiments, an advantageous way of configuring a mechanical resonator according to this invention (e.g., the mechanical resonator 300) includes providing the general relationships outlined above between the vibrating beam and the counterbalances, in each of the first and second symmetric vibrating portions. In some embodiments, it may be particularly easy, practical and/or advantageous to provide the outlined balances of various dynamic forces and moments by configuring the mechanical resonator 300 such that a first counterbalance is configured to extend from its counterbalance joining region along the X-axis direction, not only farther toward the first supporting portion than the corresponding coupling region (as indicated previously), but also farther toward the first supporting portion (and/or first mounting pad) than the corresponding first nominal non-translating suspension boundary. Each analogous counterbalance is then configured in an analogous manner. In some such embodiments, this may also include providing a mounting pad that is located between two counterbalances at a first end of the suspended portion, wherein an extent of the mounting pad along the X-axis direction at least partially overlaps with an extent of the two counterbalances along the X-axis direction (e.g., as illustrated in FIGS. 1-3). It should be appreciated that the particular embodiments outlined above are exemplary only, and not limiting. Guided by design principles disclosed herein, various embodiments or adaptations configured according to this invention may be determined based on trial and error, and/or finite element analysis or the like.

Figure 4:
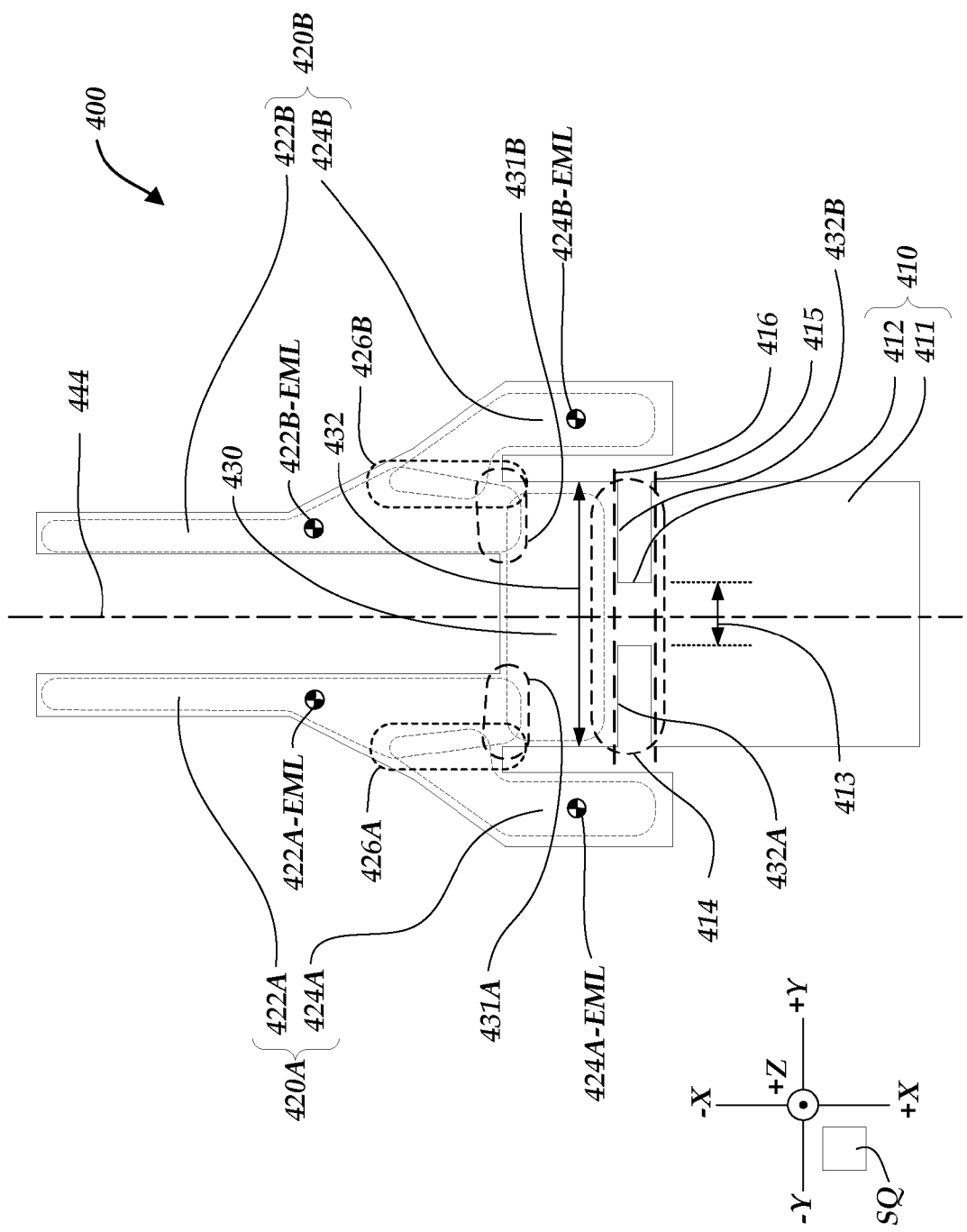
FIG. 4 is a plan view of a second configuration of a monolithic planar mechanical resonator according to the present invention.

FIG. 4 is a plan view of a second configuration of a monolithic planar mechanical resonator 400 according to the present invention. In one specific embodiment, the mechanical resonator 400 may be geometrically similar to the specific form and dimensional relationships illustrated in FIG. 4, and a unit square SQ is included in FIG. 4, for dimensional reference in case of figure distortion. However, in other embodiments the dimensional relationships between the various portions of the mechanical resonator 400 may vary from those illustrated, provided that the resulting configuration provides various design features and fulfills various design principles as outlined herein.

The form, operation, and design principles of the mechanical resonator 400 are analogous to those of the mechanical resonator 300 of FIGS. 1-3, and similarly numbered components in the 3XX and 4XX series of reference numbers (e.g., the similarly numbered elements 316 and 416, or the similarly numbered elements 326B and 426B, which have the same numerical suffix) may have similar or identical names, and may be configured in an analogous manner to provide similar functions. In particular, analogous elements may be understood to be configured to provide balanced dynamic forces and dynamic moments in an analogous manner, according to previously outlined principles. In addition, FIG. 4 follows the numbering convention that is used in FIGS. 1-3, wherein corresponding elements on opposite sides of the first symmetry axis 444 have similar numbers followed by suffixes "A" and "B," respectively (e.g., 422A and 422B). Such corresponding elements should be understood to be similarly named, similarly configured, and provide similar functions.

Accordingly, as a basis for understanding, it is sufficient to indicate that the mechanical resonator 400 is a single-end supported configuration that has only one mounting pad 411 and only one symmetry axis 444. The operative resonant mode is approximately analogous to the resonant motion of a half of the mechanical resonator 300 that is located to one side of the second symmetry axis 344 in FIGS. 1 and 2. It is particularly emphasized that the mechanical resonator 400 is configured in a manner analogous to the mechanical resonator 300, such that dynamic forces and dynamic moments arising from the first and second symmetric vibrating portions 420A and 420B, which are coupled to the first torsional coupling element 430, on respective first and second sides of the first symmetry axis 444, are nominally balanced along the nominal non-translating suspension boundary 416 proximate to the first symmetry axis 444, and along the first symmetry axis 444 proximate to the nominal non-translating suspension boundary 416, such that the nominal non-translating suspension boundary 416 is nominally not translated away from the quiescent plane and is a nominal torsional axis for a twisting deformation of the first torsional coupling element 430.

The resonant frequency of the mechanical resonator 400 may be altered by temperature variations, pressure or density variations of a surrounding medium, or applied mass variations, for example. It may thus be used as a temperature sensor, pressure or density sensor, or a thin film deposition monitor, for example.

Figure 5:
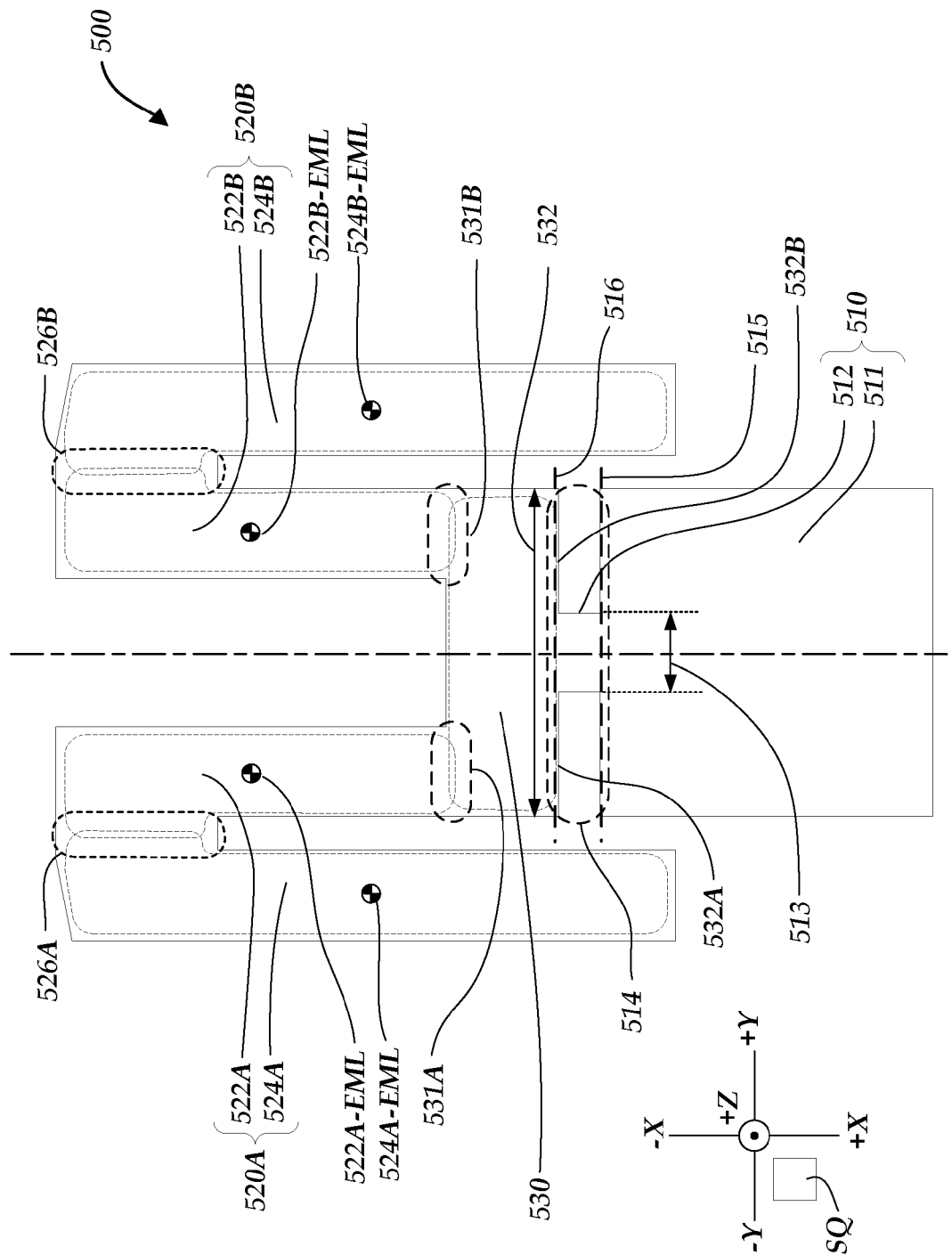
FIG. 5 is a plan view of a third configuration of a monolithic planar mechanical resonator according to the present invention.

FIG. 5 is a plan view of a third configuration of a monolithic planar mechanical resonator 500 according to the present invention. In one specific embodiment, the mechanical resonator 500 may be geometrically similar to the specific form and dimensional relationships illustrated in FIG. 5, and a unit square SQ is included in FIG. 5, for dimensional reference in case of figure distortion. However, in other embodiments the dimensional relationships between the various portions of the mechanical resonator 500 may vary from those illustrated, provided that the resulting configuration provides various design features and fulfills various design principles as outlined herein.

Many aspects of the form, operation, and design principles of the mechanical resonator 500 are analogous to those of the mechanical resonator 300 of FIGS. 1-3, and similarly numbered components in the 3XX and 5XX series of reference numbers (e.g., the similarly numbered elements 316 and 516, or the similarly numbered elements 326B and 526B, which have the same numerical suffix) may have similar or identical names, and may be configured to provide similar functions, approximately according to previously outlined principles and/or relationships, unless otherwise indicated below. In addition, FIG. 5 follows the numbering convention that is used in FIGS. 1-4, wherein corresponding elements on opposite sides of the first symmetry axis 544 have similar numbers followed by suffixes "A" and "B," respectively (e.g., 522A and 522B). Such corresponding elements should be understood to be similarly named, similarly configured, and provide similar functions.

It is particularly emphasized that the mechanical resonator 500 is configured in a manner analogous to the mechanical resonator 300, with respect to the dynamic forces and dynamic moments arising from the first and second symmetric vibrating portions 520A and 520B. Similarly to the mechanical resonator 300, these dynamic forces and dynamic moments which are coupled to the first torsional coupling element 530 on respective first and second sides of the first symmetry axis 544, are nominally balanced along the nominal non-translating suspension boundary 516 proximate to the first symmetry axis 544, and along the first symmetry axis 544 proximate to the nominal non-translating suspension boundary 516, such that the nominal non-translating suspension boundary 516 is nominally not translated away from the quiescent plane and is a nominal torsional axis for a twisting deformation of the first torsional coupling element 530. Accordingly, as a sufficient basis for understanding, only the significant differences between the operation of the components of the mechanical resonator 500 and the mechanical resonator 300 are described below.

Like the mechanical resonator 400 shown in FIG. 4, the mechanical resonator 500 is a single-end supported configuration. Accordingly, the mechanical resonator 500 has only one mounting pad 511 and only one symmetry axis 544. The operative resonant mode is described in greater detail below with reference to FIG. 6. The resonant frequency of the mechanical resonator 500 may be altered by temperature variations, pressure or density variations of a surrounding medium, or applied mass variations. It may thus be used as a temperature sensor, pressure or density sensor, or a thin film deposition monitor, for example.

Similar to the mechanical resonator 300, in the mechanical resonator 500 the first symmetric vibrating portion 520A comprises a vibrating beam 522A that is elongated along the X-axis direction, and that is joined to the first torsional coupling element 530 on its respective side of the first symmetry axis 544 at a first coupling region 531A. Similarly, a first counterbalance 524A is joined to the vibrating beam 522A along an edge of the vibrating beam 522A that faces away from the first symmetry axis, at a first counterbalance joining region 526A. However, in contrast to the mechanical resonator 300, in the mechanical resonator 500, the first counterbalance joining region 526A is located proximate to the second end of the vibrating beam 522A, which is a free and unsupported end of the vibrating beam 522A. Otherwise, the first counterbalance 524A is analogous to the first counterbalance 324A in that it is configured to extend from the first counterbalance joining region 526A along the Y-axis direction farther from the first symmetry axis than the vibrating beam 522A and along the X-axis direction farther toward the first supporting portion 510 than the first coupling region 531A. In the second symmetric vibrating portion 520B, a counterbalance 524B is joined to the vibrating beam 522B at a counterbalance joining region 526B proximate to its unsupported end, and is configured in an analogous manner.

Figure 6:
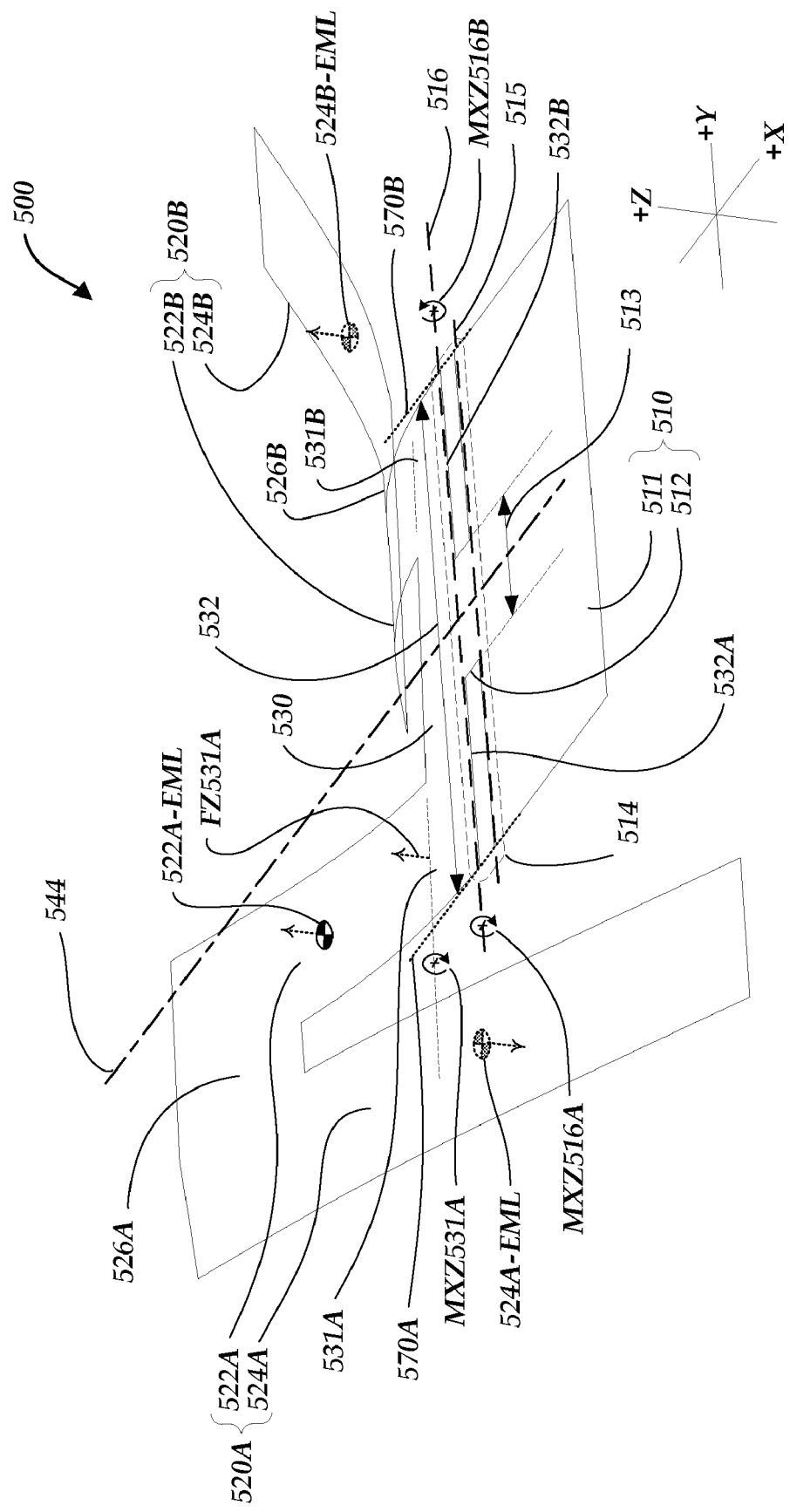
FIG. 6 is a perspective view of the mechanical resonator of FIG. 5, shown in wire frame outline and illustrating deflections of various portions of the mechanical resonator in an operative resonant mode of vibration.

FIG. 6 is perspective view of the mechanical resonator 500 of FIG. 5, shown in wire frame outline and illustrating the relative deflections of various portions of the mechanical resonator 500 in the operative resonant mode of vibration. The quiescent plane is indicated in FIG. 6 by the reference lines 570A and 570B. The scale of the deflections is exaggerated for purposes of illustration. The operative resonant modes of the mechanical resonators 300 and 500 are similar in several respects. The first and second symmetric vibrating portions 520A and 520B translate along the Z-axis direction nominally 180 degrees out of phase with one another. In the first symmetric vibrating portion 520A, it may be seen that the vibrating beam 522A and the counterbalance 524A are configured such that the vibrating beam 522A rotates in phase with the counterbalance 524A proximate to the counterbalance joining region 526A, about an axis extending along the Y-axis direction. Also, a significant portion of the counterbalance 524A translates nominally 180 degrees out of phase with the majority of the vibrating beam 522A relative to the quiescent plane, and the translational motion of the effective mass location 522A-EML of the vibrating beam 522A is at least partially counterbalanced by opposing translational motion of the effective mass location 524A-EML of the counterbalance 524A. In some embodiments, a majority of the counterbalance 524A translates nominally 180 degrees out of phase with the majority of the vibrating beam 522A relative to the quiescent plane, and the translational motion of the effective mass location 522A-EML of the vibrating beam 522A is approximately counterbalanced by opposing translational motion of the effective mass location 524A-EML of the counterbalance 524A. The second symmetric vibrating portion 520B is configured in an analogous manner. Because the first and second symmetric vibrating portions 520A and 520B vibrate nominally 180 degrees out of phase with one another, any residual dynamic Z-axis forces that are not balanced within individual symmetric vibrating portions 520A or 520B are nominally balanced overall, by the combination of the symmetric vibrating portions 520A and 520B, such that approximately no net dynamic Z-axis forces are exerted on the mounting pad 511.

Clearly, in the absence of the counterbalances 524A, and 524B, the out-of-phase dynamic forces exerted on the torsional coupling element 530 by the vibrating beams 522A and 522B would cause it to twist significantly about the symmetry axis 544. However, the counterbalances 524A and 524B are configured (e.g., with respect to their mass distribution and location) to counterbalance the twisting moment about the symmetry axis that the vibrating beams 522A and 522B apply to the torsional coupling element 330, such that the total of the dynamic moments about the symmetry axis 544 is approximately zero proximate to the nominal non-translating suspension boundary 516. In addition, it may be inferred from FIG. 6 that the end of the vibrating beam 522A exerts a small Z-axis force FZ531A, and a bending moment MXZ531A in an XZ plane, on the torsional coupling element 530 at the coupling region 531A. It may also be inferred that the resultant of the force FZ531A and the bending moment MX5331A at the nominal non-translating suspension boundary 516 is the resultant moment MXZ516A and no net Z-axis force. If a net Z-axis force acted along the nominal non-translating suspension boundary 516, it would be deflected out of the quiescent plane. By symmetry, a balancing opposite resultant moment MXZ516B is generated by the second symmetric vibrating portion 520B. The nominal non-translating suspension boundary 516 may thus be characterized as a torsional axis, and the twisting deformation of the torsional coupling element 530 about that torsional axis couples the frequencies of the first and second symmetric vibrating portions 520A and 520B to provide a high-Q mechanical resonator. Because the nominal non-translating suspension boundary 316 nominally does not translate or rotate, it may be inferred that the energy transfer from the nominal non-translating suspension boundary 516 to the adjacent supporting portion 510 is approximately minimized.

According to previously outlined principles, to achieve the characteristics outlined above at the nominal non-translating suspension boundary 516, the masses and the "effective mass locations" of the various elements of the suspended portion of the mechanical resonator 500 may be adjusted relative to one another to provide the outlined balances of various dynamic forces and moments. As previously indicated, in various embodiments an advantageous way of configuring a mechanical resonator according to this invention (e.g., the mechanical resonator 500) includes providing the general relationships outlined previously herein between the vibrating beam and counterbalance in each of the first and second symmetric vibrating portions. In some embodiments, it may be particularly easy, practical, and/or advantageous to provide the outlined balances of various dynamic forces and moments by configuring the mechanical resonator 500 such that each counterbalance is configured to extend from its counterbalance joining region along the X-axis direction, not only farther toward the supporting portion than the corresponding coupling region (as indicated previously), but also farther toward the supporting portion (and/or mounting pad) than the nominal non-translating suspension boundary. In some such embodiments, this may also include providing a mounting pad that is located between two counterbalances at the supported end of the suspended portion, wherein an extent of the mounting pad along the X-axis direction at least partially overlaps with an extent of the two counterbalances along the X-axis direction (e.g., as illustrated in FIGS. 5 and 6). It should be appreciated that the particular embodiments outlined above are exemplary only, and not limiting. Guided by design principles disclosed herein, various embodiments or adaptations configured according to this invention may be determined based on trial and error, and/or finite element analysis, or the like.

In the embodiments described above, the mechanical resonators have generally been depicted as isolated elements to be mounted to an external support structure at the mounting pads. However, it should be appreciated that in other embodiments a mechanical resonator according to this invention may be integrated into a micro-electromechanical device, or the like, using known etching techniques and/or other microfabrication techniques, and the mounting pad(s) may be integrated with, and/or indistinguishable from, a substrate of the micro-electromechanical device. The micro-electromechanical device may include circuit elements associated with the mechanical resonator operation and/or other signal processing functions, and the like. In one such embodiment, which is exemplary only and not limiting, a mechanical resonator according to this invention may be integrated into a micro-electromechanical signal filtering device, with associated circuitry, to provide an electromechanical frequency filtering element.

While the preferred embodiment of the invention has been illustrated and described, numerous variations in the illustrated and described arrangements of features and sequences of operations will be apparent to one skilled in the art based on this disclosure. Thus, it will be appreciated that various changes can be made therein without departing from the spirit and scope of the invention.

The embodiments of the invention in which an exclusive property or privilege is claimed are defined as follows:

1. A mechanical resonator, the mechanical resonator formed as a monolithic planar mechanical resonator comprising:
a first supporting portion comprising a first mounting pad; and a suspended portion configured with mirror image symmetry relative to a first symmetry axis that extends along an X-axis direction in a quiescent plane of the mechanical resonator, the suspended portion joined to the first supporting portion along a first nominal non-translating suspension boundary that extends along a Y-axis direction that is orthogonal to the X-axis direction in the quiescent plane of the mechanical resonator, the suspended portion comprising:
  a first torsional coupling element that extends across the first symmetry axis along the Y-axis direction, the first torsional coupling element joined to the first supporting portion along the first nominal non-translating suspension boundary; and
  first and second symmetric vibrating portions located on respective first and second sides of the first symmetry axis, each symmetric vibrating portion comprising:
    a vibrating beam that is elongated along the X-axis direction, the vibrating beam having first and second beam ends, the first beam end joined to the first torsional coupling element at a first coupling region on its respective side of the first symmetry axis; and
    a first counterbalance joined to the vibrating beam at a first counterbalance joining region proximate to one of the first and second beam ends, and along an edge of the vibrating beam that faces away from the first symmetry axis, the first counterbalance configured to extend along the Y-axis direction farther from the first symmetry axis than the vibrating beam and along the X-axis direction farther toward the first supporting portion than the first coupling region,
wherein the mechanical resonator is configured to provide an operative resonant mode with the first mounting pad mounted nominally along the quiescent plane of the mechanical resonator, and is configured such that in the operative resonant mode:
  the first and second symmetric vibrating portions translate primarily along a Z-axis direction normal to the quiescent plane of the mechanical resonator and nominally 180 degrees out of phase relative to one another;
  in each of the first and second symmetric vibrating portions, respectively:
    the vibrating beam and the first counterbalance rotate in phase with one another proximate to the first counterbalance joining region, about an axis extending along the Y-axis direction, and
    at least a portion of the first counterbalance translates nominally 180 degrees out of phase with a majority of the vibrating beam relative to the quiescent plane; and
  dynamic forces and dynamic moments arising from the first and second symmetric vibrating portions and coupled to the first torsional coupling element on the respective first and second sides of the first symmetry axis are nominally balanced along the first nominal non-translating suspension boundary proximate to the first symmetry axis and along the first symmetry axis proximate to the first nominal non-translating suspension boundary, such that the first nominal non-translating suspension boundary is nominally not translated away from the quiescent plane and is a nominal torsional axis for a twisting deformation of the first torsional coupling element.

2. The mechanical resonator of claim 1, wherein a majority of the first counterbalance translates nominally 180 degrees out of phase with the majority of the vibrating beam relative to the quiescent plane.

3. The mechanical resonator of claim 1, wherein the first supporting portion comprises a first bridge portion that extends from a nominal mounting boundary of the first mounting pad and is joined to the first torsional coupling element approximately along the first nominal non-translating suspension boundary.

4. The mechanical resonator of claim 3, wherein the first torsional coupling element has a torsional coupling element dimension along the Y-axis direction, and the first bridge portion is joined to the first torsional coupling element along a joining dimension that is shorter than the torsional coupling element dimension, such that the first torsional coupling element includes unconstrained edge portions proximate to the first nominal non-translating suspension boundary.

5. The mechanical resonator of claim 1, wherein the first counterbalance is configured to extend along the Y-axis direction farther from the first symmetry axis than the vibrating beam and along the X-axis direction farther toward the first supporting portion than the first nominal non-translating suspension boundary.

6. The mechanical resonator of claim 5, wherein the first mounting pad is configured such that it is located between the first counterbalances of the first and second symmetric vibrating portions, and wherein an extent of the first mounting pad along the X-axis direction at least partially overlaps with an extent of the first counterbalances along the X-axis direction.

7. The mechanical resonator of claim 1, the mechanical resonator comprising a single-end supported configuration, wherein the first mounting pad is the only mounting pad and the second end of each vibrating beam is unsupported.

8. The mechanical resonator of claim 7, wherein the first counterbalance joining region is proximate to the first beam end.

9. The mechanical resonator of claim 7, wherein the first counterbalance joining region is proximate to the second beam end.

10. The mechanical resonator of claim 1, the mechanical resonator comprising a double-end supported configuration, including:
  a second supporting portion comprising a second mounting pad; and
  the suspended portion is configured with minor image symmetry relative to the first symmetry axis and relative to a second symmetry axis that extends along the Y-axis direction in the quiescent plane of the mechanical resonator, the suspended portion joined to the second supporting portion along a second nominal non-translating suspension boundary that extends along the Y-axis direction, the suspended portion comprising:
    a second torsional coupling element that extends across the first symmetry axis along the Y-axis direction, the second torsional coupling element joined to the second supporting portion along the second nominal non-translating suspension boundary; and
    the first and second symmetric vibrating portions, wherein each symmetric vibrating portion comprises:
      the vibrating beam that is elongated along the X-axis direction, the first beam end joined to the first torsional coupling element at the first coupling region on its respective side of the first symmetry axis and the second beam end joined to the second torsional coupling element at a second coupling region on its respective side of the first symmetry axis; and the first counterbalance joined to the vibrating beam at the first counterbalance joining region proximate to the first beam ends, and a second counterbalance joined to the vibrating beam at a second counterbalance joining region proximate to the second beam end and along the edge of the vibrating beam that faces away from the first symmetry axis, the second counterbalance configured to extend along the Y-axis direction farther from the first symmetry axis than the vibrating beam and along the X-axis direction farther toward the second supporting portion than the second coupling region, wherein the mechanical resonator is configured to provide an operative resonant mode with the first and second mounting pads mounted nominally along the quiescent plane of the mechanical resonator, and is configured such that in the operative resonant mode:

the first and second symmetric vibrating portions translate primarily along a Z-axis direction normal to the quiescent plane of the mechanical resonator and nominally 180 degrees out of phase relative to one another;

in each of the first and second symmetric vibrating portions, respectively:

the vibrating beam and the first counterbalance rotate in phase with one another proximate to the first counterbalance joining region, about an axis extending along the Y-axis direction, and the vibrating beam and the second counterbalance rotate in phase with one another proximate to the second counterbalance joining region, about an axis extending along the Y-axis direction, and at least a portion of the first counterbalance and at least a portion of the second counterbalance translate nominally 180 degrees out of phase with a majority of the vibrating beam relative to the quiescent plane; and dynamic forces and dynamic moments arising from the first and second symmetric vibrating portions and coupled to the second torsional coupling element on the respective first and second sides of the first symmetry axis are nominally balanced along the second nominal non-translating suspension boundary proximate to the first symmetry axis and along the first symmetry axis proximate to the second nominal non-translating suspension boundary, such that the second nominal non-translating suspension boundary is nominally not translated away from the quiescent plane and is a nominal torsional axis for a twisting deformation of the second torsional coupling element.

11. The mechanical resonator of claim 10, wherein a majority of the first counterbalance and a majority of the second counterbalance translate nominally 180 degrees out of phase with the majority of the vibrating beam relative to the quiescent plane.

12. The mechanical resonator of claim 10, wherein:
the first supporting portion comprises a first bridge portion that extends from a nominal mounting boundary of the first mounting pad and is joined to the first torsional coupling element approximately along the first nominal non-translating suspension boundary; and the second supporting portion comprises a second bridge portion that extends from a nominal mounting boundary of the second mounting pad and is joined to the second torsional coupling element approximately along the second nominal non-translating suspension boundary.

13. The mechanical resonator of claim 12, wherein:
the first torsional coupling element has a torsional coupling element dimension along the Y-axis direction, and the first bridge portion is joined to the first torsional coupling element along a joining dimension that is shorter than the torsional coupling element dimension, such that the first torsional coupling element includes unconstrained edge portions proximate to the first nominal non-translating suspension boundary; and the second torsional coupling element has a torsional coupling element dimension along the Y-axis direction, and the second bridge portion is joined to the second torsional coupling element along a joining dimension that is shorter than the torsional coupling element dimension, such that the second torsional coupling element includes unconstrained edge portions proximate to the second nominal non-translating suspension boundary.

14. The mechanical resonator of claim 10, wherein:
the first counterbalance is configured to extend along the Y-axis direction farther from the first symmetry axis than the vibrating beam and along the X-axis direction farther toward the first supporting portion than the first nominal non-translating suspension boundary; and the second counterbalance is configured to extend along the Y-axis direction farther from the first symmetry axis than the vibrating beam and along the X-axis direction farther toward the second supporting portion than the second nominal non-translating suspension boundary.

15. The mechanical resonator of claim 14, wherein:
the first mounting pad is configured such that it is located between the first counterbalances of the first and second symmetric vibrating portions, and wherein an extent of the first mounting pad along the X-axis direction at least partially overlaps with an extent of the first counterbalances along the X-axis direction; and the second mounting pad is configured such that it is located between the second counterbalances of the first and second symmetric vibrating portions, and wherein an extent of the second mounting pad along the X-axis direction at least partially overlaps with an extent of the second counterbalances along the X-axis direction.

16. The mechanical resonator of claim 10, wherein the mechanical resonator is integrated into a micro-electromechanical device and the first and second mounting pads are integrated with a substrate of the micro-electromechanical device.

17. The mechanical resonator of claim 1, the mechanical resonator comprising a single-end supported configuration, wherein the mechanical resonator is integrated into a micro-electromechanical device and the first mounting pad is integrated with a substrate of the micro-electromechanical device.

* * * * *

UNITED STATES PATENT AND TRADEMARK OFFICE
CERTIFICATE OF CORRECTION

| | |
|---|---|
| PATENT NO. | : 8,143,768 B2 |
| APPLICATION NO. | : 12/784441 |
| DATED | : March 27, 2012 |
| INVENTOR(S) | : R. A. Hanson |

It is certified that error appears in the above-identified patent and that said Letters Patent is hereby corrected as shown below:

| COLUMN | LINE | |
|---|---|---|
| In the Claims | | |
| 18 | 46 | "minor image" should read |
| Claim 10 | | --mirror image-- |

Signed and Sealed this
Twenty-third Day of July, 2013

Teresa Stanek Rea
*Acting Director of the United States Patent and Trademark Office*